United States Patent
Tiwari et al.

(10) Patent No.: US 9,564,904 B2
(45) Date of Patent: Feb. 7, 2017

(54) ASYNCHRONOUS HIGH-SPEED PROGRAMMABLE DIVIDER

(71) Applicant: STMicroelectronics International N.V., Amsterdam (NL)

(72) Inventors: Jeet Narayan Tiwari, Greater Noida (IN); Nitin Gupta, Kurukshetra (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 135 days.

(21) Appl. No.: 14/691,738

(22) Filed: Apr. 21, 2015

(65) Prior Publication Data

US 2016/0315621 A1    Oct. 27, 2016

(51) Int. Cl.
| | | |
|---|---|---|
| H03K 21/00 | (2006.01) | |
| H03K 23/00 | (2006.01) | |
| H03K 21/02 | (2006.01) | |
| H03K 23/68 | (2006.01) | |
| H03K 23/58 | (2006.01) | |
| H03K 23/66 | (2006.01) | |

(52) U.S. Cl.
CPC ............. *H03K 21/026* (2013.01); *H03K 21/00* (2013.01); *H03K 23/00* (2013.01); *H03K 23/58* (2013.01); *H03K 23/667* (2013.01); *H03K 23/68* (2013.01)

(58) Field of Classification Search
None
See application file for complete search history.

(56) References Cited

U.S. PATENT DOCUMENTS

| | | | | | |
|---|---|---|---|---|---|
| 5,826,071 | A | * | 10/1998 | Narayan | ................. G06F 7/764 712/224 |
| 5,944,774 | A | * | 8/1999 | Dent | ......................... G06F 7/49 708/517 |
| 5,966,421 | A | * | 10/1999 | Haubursin | ............. H03K 23/66 377/44 |
| 7,512,208 | B2 | * | 3/2009 | Noeske | ................. H03K 23/48 377/47 |
| 8,559,587 | B1 | * | 10/2013 | Buell | ................... H03K 23/662 377/47 |
| 2007/0160179 | A1 | * | 7/2007 | Narathong | ............ H03L 7/0802 377/47 |
| 2012/0161823 | A1 | | 6/2012 | Gupta | |
| 2014/0306740 | A1 | * | 10/2014 | Guyton | ................. H03K 23/58 327/115 |

* cited by examiner

*Primary Examiner* — Tuan T Lam

(74) *Attorney, Agent, or Firm* — Gardere Wynne Sewell, LLP

(57) ABSTRACT

A method of dividing a clock signal by an input signal of N bits with M most significant bits is described herein. The method includes dividing the clock signal by the most significant bits of the input signal $2^{N-M}-1$ times out of $2^{N-M}$ divisions of the clock signal, using a divider. The clock signal is divided by a sum of the most significant bits and the least significant bits one time out of $2^{N-M}$ divisions of the clock signal, using the divider. The clock signal is also divided by $2^{N-M}$, $2^{N-M}$ times, using the divider.

19 Claims, 3 Drawing Sheets

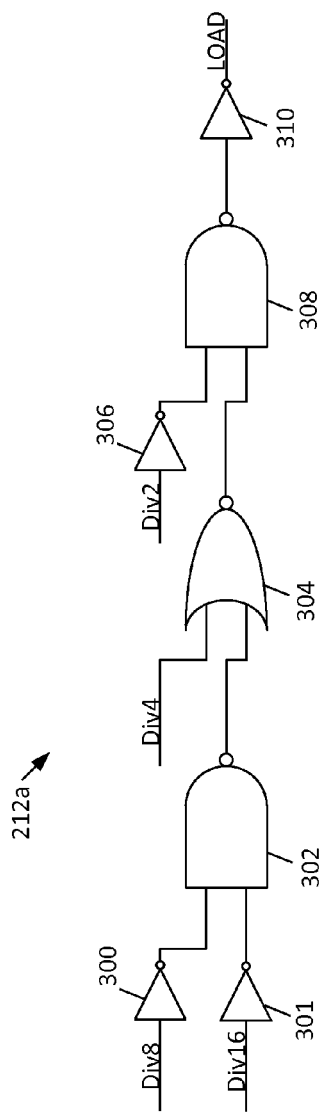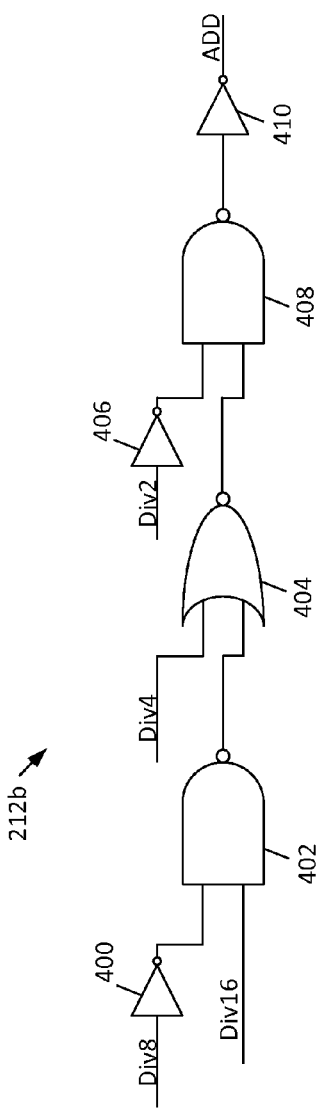

ASYNCHRONOUS HIGH-SPEED PROGRAMMABLE DIVIDER

TECHNICAL FIELD

This disclosure is related to the field of divider circuits, and, more particularly, to asynchronous divider circuits.

BACKGROUND

Phase-locked loops are widely employed in radio, telecommunications, smartphones, computers, and other electronic applications. They can be used in circuits which function to demodulate a signal, recover a signal from a noisy communication channel, generate a stable frequency at multiples of an input frequency, or distribute precisely timed clock pulses in digital logic circuits such as microprocessors.

Such phase-locked loops typically employ asynchronous counters and dividers to divide a clock signal down to another frequency. However, asynchronous counters have a maximum operation frequency that decreases as the number of bits of the divisor used increases due to the delay in each of its stages due to ripple. In addition, power consumption increases as the number of bits of the divisor increases.

Therefore, new designs for asynchronous counters that can work at higher frequencies and consume less power are desirable.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

A circuit described herein includes an input configured to receive an input signal having most significant bits and least significant bits. An adder is configured to add the most significant bits of the input signal to an operand so as to produce a divisor. A divider is configured to divide a clock signal by the divisor a given number of times, the given number of times being equal to two raised to a difference between a total number of bits in the input signal and a number of most significant bits of the input signal. A logic circuit is configured to generate the operand as zero one less than the given number of times spread over the given number of times that the divider is to divide the clock signal, and generate the operand as the least significant bits of the number signal one time during the given number of times that the divider is to divide the clock signal.

An additional divider is configured to, after each division by the divider, divide by two raised to a difference between the total number of bits in the input signal and the number of most significant bits in the input signal.

The logic circuit includes a first logic block configured to generate a first signal having a first logic level (i.e. high) based upon the divider having divided the clock signal by the divisor a number of times less than the number of bits in the input signal, or the divider having divided the clock signal by the divisor a number of times greater than the number of bits in the input signal. The first logic block is also configured to generate the first signal having a second logic level (i.e. low) based upon the divider having divided the clock signal by the divisor a number of times equal to the number of bits in the input signal. A logic gate generates the operand as zero based upon the first signal having the first logic level, and generates the operand as the least significant bits based upon the first signal having the second logic level.

The logic gate may be a pass gate. The first logic block may be a counter. A latch latches the input signal based upon a second signal. The logic circuit includes a second logic block configured to generate the second signal based upon the divider having divided the clock signal by the divisor the given number of times.

BRIEF DESCRIPTION OF THE DRAWINGS

FIG. 3 is a block diagram of the first combinational logic of FIG. 2.

FIG. 4 is a block diagram of the second combinational logic of FIG. 2.

DETAILED DESCRIPTION

One or more embodiments will be described below. These described embodiments are only examples of implementation techniques, as defined solely by the attached claims. Additionally, in an effort to provide a focused description, irrelevant features of an actual implementation may not be described in the specification.

Figure 1:
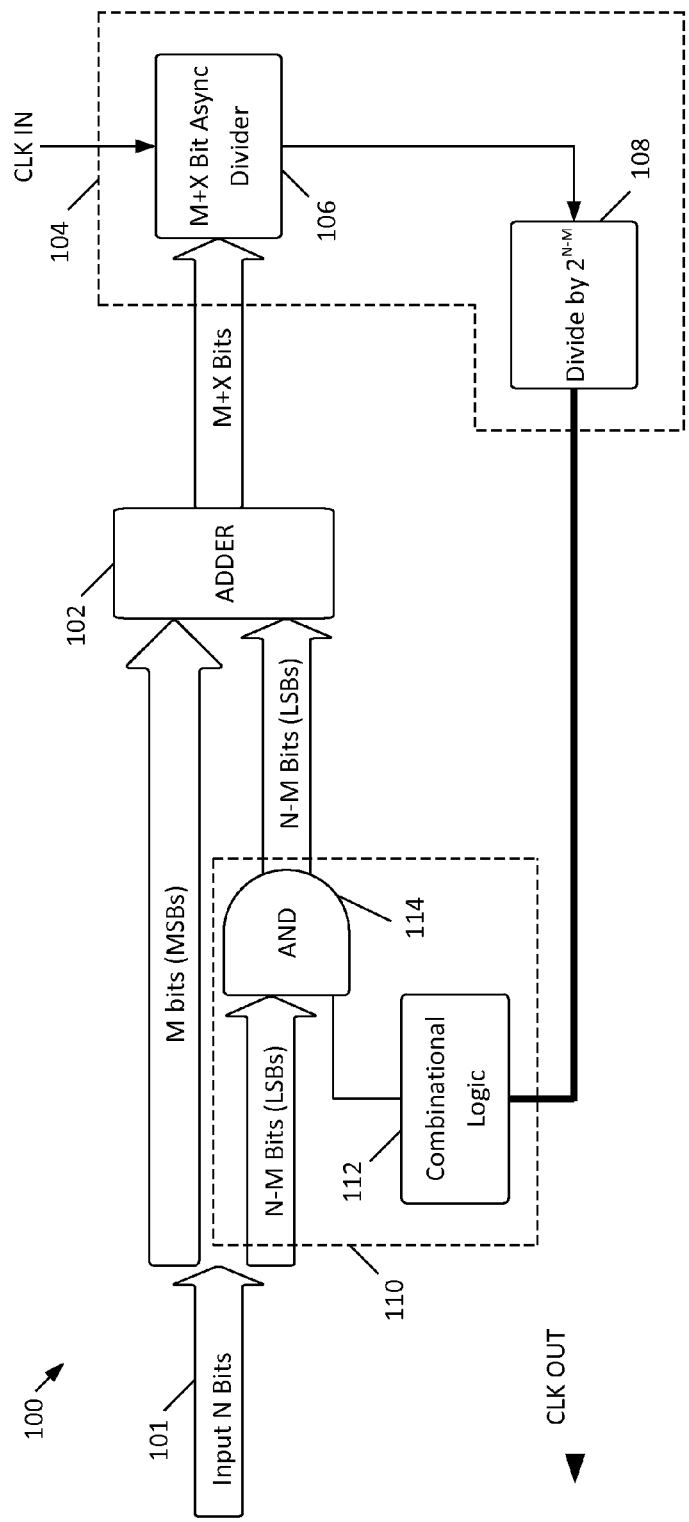
FIG. 1 is a block diagram of an electronic device including an asynchronous counter employing an asynchronous divider, in accordance with this disclosure.

With reference to FIG. 1, an electronic device 100, such as a PLL for a display port, is now described. The electronic device 100 includes a control input 101 that receives an N-bit input signal representing a divisor value for dividing the clock signal of the PLL. The N-bit input signal is split into its M most significant bits (MSBs) and N-M least significant bits (LSBs). An adder 102 adds the MSBs of the input signal to a selectable operand so as to produce a selectable divisor of M+X bits, with X being a carry bit or bits resulting from the addition of the MSBs and the operand. A divider 104 divides a clock signal CLKIN by the selectable divisor a total number of times equal to $2^{N-M}$. The selectable divisor is the MSBs $2^{N-M}-1$ times out of $2^{N-M}$ times, and is the sum of the MSBs and the LSBs one time. After each division by the selectable divisor 106, a further fixed divider 108 then divides the clock signal by $2^{N-M}$.

The divisor for the divider 104 is selectable due to the MSBs of the input signal being added to a selectable operand. The operand is generated, or "selected", by a logic circuit 110 based upon the number of times the divider 104 has divided the clock signal, and may have a value of either zero or the LSBs of the input signal. The operand may be generated as the LSBs signal once, at any point during the $2^{N-M}$ divisions of the clock signal. For example, the operand may be generated as being zero for the first P divisions of the clock signal by the divider 104, where $P<2^{N-M}$. As an example, P may be $2^{N-M}/2$. Then, for the P+1 division of the clock signal by the divider 104, the operand may be generated as being the LSBs. For the P+2 to the $2^{N-M}$ divisions of the clock signal by the divider 104, the operand may again be generated as being zero. Thus, for the first P divisions of the clock signal by the divider 104, the adder 102 may generate the divisor as the MSBs, for the P+1 division of the clock signal by the divider 104, the adder 102 may generate the divisor as a sum of the MSBs and the LSBs, and for the P+2 to $2^{N-M}$ divisions of the clock signal by the divider 104, the adder 102 generates the divisor again as the MSBs.

Stated another way, the operand is generated by the logic circuit 110 as zero when the divider 104 has divided the clock signal by the divisor a number of times P less than the $2^{N-M}$ bits of the input signal. Thus, once the divider 104 has generated the clock signal by the divisor P times, the logic circuit 110 generates the operand as the LSBs, which are used by the adder 102 to generate the divisor as the sum of the MSBs and the LSBs.

The operand is again generated by the logic circuit 110 as zero when the divider 104 has divided the clock signal by the divisor a number of times greater than the P, which is used by the adder 102 to generate the divisor as the MSBs.

Thus, it is understood that the divider 104 divides the clock signal by the MSBs of the input signal $2^{N-M}-1$ times and the divider divides the clock signal by MSBs+LSBs one time, with the divide by MSBs+LSBs being performed after the divider 104 has divided the clock signal by the MSBs P times.

The divider 104 comprises an M+X bit asynchronous divider 106, which divides the clock signal by the divisor, and an additional divider 108, which divides the quotient from the asynchronous divider 106 by $2^{N-M}$ on each iteration as well. Various outputs from the additional divider 108 are fed to the logic circuit 110 for use in generating the operand.

The logic circuit 110 includes a first logic block or combinational logic circuit 112 that generates a first signal having a first logic level (i.e. low) based upon the divider 104 having divided the clock signal by the divisor less than P times or more than P+1 times. If the divider 104 has divided the clock signal by the divisor P times, the combinational logic circuit 112 generates the first signal as having a second logic level (i.e. high). An AND gate 114 receives the LSBs and passes the LSBs through to the adder 102 when the first signal is at the second logic level (i.e. high).

As will be understood by those of skill in the art, because the clock is divided by the divisor at each iteration, and because the divisor is the MSBs of the input signal during some iterations, the minimum divide of the clock that can be performed by the divider 104 is where the MSBs (converted to decimal) are equal to one, and is thus $2^{N-M}$. The maximum divide of the clock that can be performed by the divider 104 is where the MSBs and LSBs are all ones, and is thus $(2^M-1)*(2^{N-M}-1)+$the decimal value of MSBs+LSBs Since the asynchronous divider 106 accepts M+X bits, as opposed to N bits (where N>M+X) like prior electronic devices, it has fewer internal stages, and can therefore run at higher speeds. The usage of the additional divider 108 helps maintain the duty cycle of the divider 104 despite the reduced number of bits handled by the asynchronous divider 106. Thus, the electronic device 100 can run at higher speeds than typical prior electronic devices, while still maintaining a desirable duty cycle.

In addition, the reduction of the number of bits handled by the asynchronous divider 108 leads to a reduction in power consumption, as fewer components of the electronic device 100 run at the frequency of the clock signal (since the asynchronous divider 108 has fewer components than those in prior designs).

Figure 2:
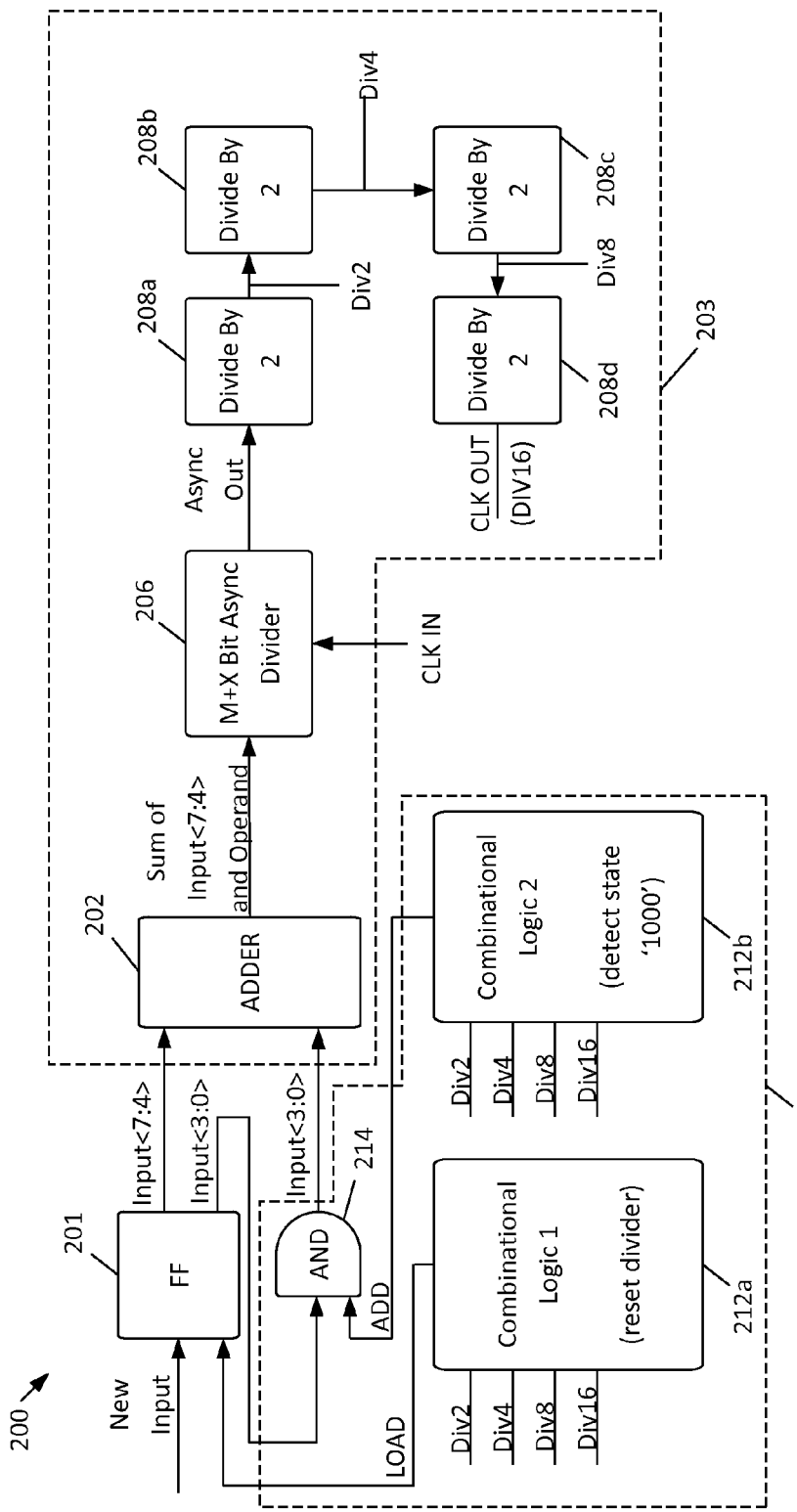
FIG. 2 is a more detailed block diagram of an electronic device including an asynchronous counter with an adder and asynchronous divider, in accordance with this disclosure.

Those of skill in the art will understand that the electronic device 100 described herein can work for input signals 101 of at least two bits. As an example, a more detailed implementation of the electronic device 200 in which the input signal has 8 bits will now be described with reference to FIG. 2.

Here, the electronic device 200 includes a multi bit latch flip flop 201, which latches the input signal to its output when clocked by a signal from a logic circuit 210 denoted as LOAD. An asynchronous divider 203 receives the MSBs of the input signal, denoted as Input<7:4>, and sums Input<7:4> with a selectable operand. The result of this summation is a divisor to be used to divide a clock signal.

The asynchronous divider 203 performs 16 iterations, that is two raised to the difference between the total number of bits in the input signal and the number of MSBs in the input signal. During each iteration, the asynchronous divider 203 divides the clock by the divisor once, and then by two four times. For the first eight $(2^{(N-M)}/2)$ iterations of the asynchronous divider 203, an operand of zero is sent by the logic circuit 210 to the pass gate 214, which is summed with Input<7:4> so as to produce a divisor of Input<7:4>. For the ninth $(2^{(N-M)}/2+1)$ iteration of the asynchronous divider 203, an operand that is the LSBs, denoted as Input<3:0>, is sent by the logic circuit 210 to the pass gate 214 which is summed with the Input<7:4> to produce a divisor of Input<7:4>+Input<3:0>. For the tenth through sixteenth $(2^{(N-M+2)}/2$ to $2^{(N-M)})$ iteration of the asynchronous divider 203, an operand of zero is sent again by the logic circuit 210 to the pass gate 214.

The asynchronous divider 203 comprises a 4-bit adder 202 that returns a 4-bit sum and a carry bit. The adder 202 receives Input<7:4> and the operand (which is either zero, or Input<3:0> as described above), and sums them. This sum is sent to the asynchronous divider 206, which uses the sum as a divisor. The output of the asynchronous divider 206 is passed to a series of additional dividers 208a-208d, which each in turn divide by two. The outputs of the dividers 208a-208d, denoted as Div2, Div4, Div8, and Div16, are passed to the logic circuit 210 for use in generating the signal LOAD, as well as a signal ADD used in generation of the operand.

The logic circuit 210 comprises a first combinational logic 212a, which serves to reload the electronic device 200 by clocking the flip flop 201 by generating the signal LOAD. The first combinational logic 212a receives Div2, Div4, Div8, and Div16 from the additional dividers 208a-208d, assembles them as a first byte, and detects the state "0000" in the first byte. When the state "0000" is reached, the combinational logic 212a outputs the signal LOAD as high, clocking a new input signal through the flip flop 201.

It should be noted that a new input may be applied to the inputs of the flip flop 201 prior to the state "0000" being reached. Thus, the new input signal can be clocked through the flip flop 201 synchronously with the reaching of the state "0000", allowing seamless and glitch free switching of the electronic device 200 to performing a new division.

The logic circuit 210 further comprises a second combinational logic 212b, which serves to generate a signal ADD to a pass gate 214. The combinational logic circuit 212b receives Div2, Div4, Div8, and Div16 from the additional dividers 208a-208d, assembles them as a second byte, and detects the state "1000" in the second byte. When the state "1000" is reached, the combinational logic 212b outputs the signal ADD as high, causing the AND gate 214 to pass through Input<3:0> to be used as the operand instead of zero.

Implementation details of the first combinational logic 212a are now described with reference to FIG. 3. The first combinational logic 212a comprises a pair of inverters 300, 301 that receive the Div8 and Div16 signals, respectively. The outputs of the inverters 300, 301 are fed to the inputs of a first NAND gate 302. The output of the first NAND gate 302 is fed to an input of a NOR gate 304, which also receives the Div4 signal as another input. The output of the NOR gate 304 is fed to the input of a second NAND gate 308. The second NAND gate 308 also receives an inverted version of the Div2 signal from an inverter 306 as input. The output of the second NAND gate 308 is then inverted by an inverter 310 to produce the signal LOAD.

Implementation details of the second combinational logic 212b are now described with reference to FIG. 4. The first combinational logic 212b comprises an inverter 400 that receives the Div8 signal. The output of the inverter 400 is fed an input of a first NAND gate 402. The Div16 signal is fed to the other input of the first NAND gate 402. The output of the first NAND gate 402 is fed to a NOR gate 404 as input, which also receives the Div4 signal as input. The output of the NOR gate 404 is fed to the input of a second NAND gate 408. The second NAND gate 408 also receives an inverted version of the Div2 signal from an inverter 406 as input. The output of the second NAND gate 408 is then inverted by an inverter 410 to produce the signal ADD.

Those of skill in the art will appreciate that the first combinational logic 212a may instead be a $2^{N-M}$ bit counter, and the second combinational logic 212b may instead be a $2^{N-M}$ bit counter.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
   an input configured to receive an input signal comprising most significant bits and least significant bits;
   an adder configured to add the most significant bits of the input signal to an operand so as to generate a divisor;
   a divider configured to divide a clock signal by the divisor a given number of times, the given number of times being equal to two raised to a difference between a total number of bits in the input signal and a number of most significant bits in the input signal;
   a logic circuit configured to:
      generate the operand as zero one less than the given number of times spread over the given number of times that the divider is to divide the clock signal,
      generate the operand as the least significant bits of the number signal one time during the given number of times that the divider is to divide the clock signal.

2. The circuit of claim 1, further comprising an additional divider configured to, after each division by the divider, divide by two raised to a difference between a total number of bits in the input signal and a number of most significant bits in the input signal.

3. The circuit of claim 1, wherein the logic circuit comprises:
   a first logic block configured to
      generate a first signal having a first logic level based upon
         the divider having divided the clock signal by the divisor a number of times less than the number of bits in the input signal, or
         the divider having divided the clock signal by the divisor a number of times greater than the number of bits in the input signal, and
      generate the first signal having a second logic level based upon the divider having divided the clock signal by the divisor a number of times equal to the number of bits in the input signal; and
   a logic gate to generate the operand as zero based upon the first signal having the first logic level, and to generate the operand as the least significant bits based upon the first signal having the second logic level.

4. The circuit of claim 3, wherein the logic gate comprises an AND gate.

5. The circuit of claim 3, wherein the first logic block comprises a counter.

6. The circuit of claim 1, further comprising a latch to latch the input signal based upon a second signal.

7. The circuit of claim 6, wherein the logic circuit comprises a second logic block configured to generate the second signal based upon the divider having divided the clock signal by the divisor the given number of times.

8. A circuit for iteratively dividing a dividend by an input signal, the circuit comprising:
   a latch configured to latch an input signal;
   a divider configured to divide the dividend by a selectable divisor, the selectable divisor being equal to most significant bits of the input signal at one iteration and a sum of the most significant bits of the input signal and least significant bits of the input signal at another iteration.

9. The circuit of claim 8, wherein the selectable divisor is generated by an adder configured to add the most significant bits of the input signal to an operand so as to produce the selectable divisor.

10. The circuit of claim 9, further comprising a logic circuit configured to:
    generate the operand as zero when the divider has divided the clock signal by the divisor a number of times less than one half of two raised to a difference between a total number of bits in the input signal and a number of most significant bits in the input signal;
    generate the operand as least significant bits of the input signal when the divider has divided the clock signal by the divisor a number of times equal to one half of two raised to the difference between a total number of bits in the input signal and a number of most significant bits in the input signal; and
    generate the operand as zero when the divider has divided the clock signal by the divisor a number of times greater than one half of two raised to the difference between a total number of bits in the input signal and a number of most significant bits in the input signal.

11. The circuit of claim 10, wherein the logic circuit comprises:
    a first logic block configured to generate a first signal having a first logic level based upon a quotient resulting from dividing the dividend by the divisor not having a given value and the first signal having a second logic level based upon the quotient resulting from dividing the dividend by the divisor having the given value; and
    a logic gate to generate the operand as zero based upon the first signal having the first logic level, and to generate the operand as the least significant bits based upon the first signal having the second logic level.

12. The circuit of claim 8, further comprising an additional divider configured to, after division by the divider, divide by two raised to a difference between a total number of bits in the input signal and a number of most significant bits in the input signal.

13. A method for iteratively dividing a dividend by an input signal, the method comprising:

dividing the dividend by a selectable divisor, the selectable divisor being equal to either most significant bits of the input signal or a sum of the most significant bits of the input signal and least significant bits of the input signal, using a divider;

selecting the divisor based on a number of previous iterations, using a logic circuit.

14. The method of claim 13, wherein selecting the divisor comprises selecting the divisor as equal to the most significant bits of the input signal based upon the number of previous iterations being less than one half of two raised to the difference between a total number of bits in the input signal and a number of most significant bits in the input signal, or based upon the number of previous iterations being greater than one half of two raised to the difference between a total number of bits in the input signal and a number of most significant bits in the input signal.

15. The method of claim 14, wherein selecting the divisor further comprises selecting the divisor as equal to the sum of the most significant bits of the input signal and the least significant bits of the input signal based upon the number of previous iterations being equal to one half of two raised to the difference between a total number of bits in the input signal and a number of most significant bits in the input signal.

16. The method of claim 13, further comprising after each division by the divider, dividing the dividend by two raised to the difference between a total number of bits in the input signal and a number of most significant bits in the input signal.

17. A method, comprising:

latching an input signal comprising N bits with M most significant bits, using a latch;

dividing a clock signal by the most significant bits of the input signal $2^{N-M}-1$ times out of $2^{N-M}$ divisions of the clock signal, using a divider;

dividing the clock signal by a sum of the most significant bits and the least significant bits one time out of $2^{N-M}$ divisions of the clock signal, using the divider; and dividing the clock signal by $2^{N-M}$, $2^{N-M}$ times, using the divider.

18. The method of claim 17, further comprising applying a new input signal to the latch prior to completing $2^{N-M}$ divisions of the clock signal.

19. The method of claim 18, further comprising latching the new input signal synchronously with completion of $2^{N-M}$ divisions of the clock signal, using the latch.

* * * * *